United States Patent
Schultz et al.

(10) Patent No.: US 7,586,233 B2
(45) Date of Patent: Sep. 8, 2009

(54) FERROELASTIC CERAMIC-REINFORCED METAL MATRIX COMPOSITES

(75) Inventors: Jeffrey Patrick Schultz, Blacksburg, VA (US); Ted Ankomahene Asare, Blacksburg, VA (US); Ben David Poquette, Blacksburg, VA (US); Stephen Lynn Kampe, Floyd, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 260 days.

(21) Appl. No.: 11/584,861

(22) Filed: Oct. 23, 2006

(65) Prior Publication Data

US 2007/0138917 A1    Jun. 21, 2007

Related U.S. Application Data

(63) Continuation-in-part of application No. 10/851,022, filed on May 21, 2004, now Pat. No. 7,126,257.

(60) Provisional application No. 60/472,742, filed on May 23, 2003.

(51) Int. Cl.
*H01L 41/08* (2006.01)

(52) U.S. Cl. .................................... 310/311; 310/358

(58) Field of Classification Search .............. 310/311
See application file for complete search history.

(56) References Cited

U.S. PATENT DOCUMENTS

| | | | |
|---|---|---|---|
| 3,586,415 A * | 6/1971 | Kumda et al. ............... | 359/251 |
| 4,944,185 A | 7/1990 | Clark, Jr. et al. | |
| 5,132,278 A | 7/1992 | Stevens et al. | |
| 5,392,982 A | 2/1995 | Li | |
| 6,228,481 B1 | 5/2001 | Yamada et al. | |
| 6,261,360 B1 | 7/2001 | Dry | |
| 6,284,692 B1 * | 9/2001 | Jue et al. ..................... | 501/103 |
| 6,527,849 B2 | 3/2003 | Dry | |
| 7,090,785 B2 * | 8/2006 | Chiang et al. ........... | 252/62.9 R |

* cited by examiner

*Primary Examiner*—Mark Budd
(74) *Attorney, Agent, or Firm*—Alan G. Towner, Esq.; Pietragallo Gordon Alfano Bosick & Raspanti, LLP

(57) ABSTRACT

Composite materials comprising ferroelastic ceramic particulates dispersed in a metal matrix are capable of vibration damping. When the ferroelastic ceramic particulates are subjected to stress, such as the cyclic stress experienced during vibration of the material, internal stresses in the ceramic cause the material to deform via twinning, domain rotation or domain motion thereby dissipating the vibrational energy. The ferroelastic ceramic particulates may also act as reinforcements to improve the mechanical properties of the composites. The composite materials may be used in various structural components in vehicles, aircraft, spacecraft, buildings and tools.

23 Claims, 4 Drawing Sheets

SPHERE
$a_1 = a_2 = a_3$

PROLATE SPHEROID
$a_1 = a_2 < a_3$
$a_3 / a_1 = 5$

DISC
$a_1 = a_2 \gg a_3$
$a_3 / a_1 = 0.1$

Micrograph of Ni-BaTiO3 MMC

FERROELASTIC CERAMIC-REINFORCED METAL MATRIX COMPOSITES

CROSS-REFERENCE TO RELATED APPLICATION

This application is a continuation-in-part of U.S. patent application Ser. No. 10/851,022 filed May 21, 2004, now U.S. Pat. No. 7,126,257 granted on Oct. 24, 2006, which claims the benefit of U.S. Provisional Patent Application Ser. No. 60/472,742 filed May 23, 2003, which is herein incorporated by reference.

GOVERNMENT CONTRACT

The United States Government has certain rights to this invention pursuant to Contract No. DAA 19-01-1-0714 awarded by the U.S. Army Research Office.

FIELD OF THE INVENTION

The present invention relates to ferroelastic ceramic-reinforced metal matrix composite materials which are useful for structural applications, and which are capable of passively damping vibrations.

BACKGROUND INFORMATION

Structural materials and components that would benefit from vibration damping include automobile components, aircraft components, marine components, building components, hand tools, sports equipment, propulsion units, space structures, platforms and the like.

Many materials used in various structural applications possess relatively poor vibration damping characteristics. Vibration damping in structural high-load components is currently achieved through the use of external components such as elastomeric mounting materials or actively controlled vibration dampers. Vibration reduction is thus achieved through the use of damping materials and components that are often added extrinsically to the existing structure.

The present invention has been developed in view of the foregoing.

SUMMARY OF THE INVENTION

The present invention provides a metal matrix composite material reinforced with discontinuous ferroelastic ceramic particulates, which are dispersed in the metallic matrix. The inclusion of ferroelastic ceramic particulates allows the composite to exhibit exceptional passive damping capabilities while maintaining a high degree of structural strength. The composites provide passive vibration damping through the conversion of strain to twinning of the ferroelastic domains in response to an applied stress. The present composite materials can be used in high load applications without the need for additional vibration damping materials. Additionally, the matrix may be further strengthened through dispersion strengthening mechanisms that involve the presence of effective obstacles to dislocation motion. Improved combinations of structural strength and vibration damping are achieved with the present materials.

An aspect of the present invention is to provide a method of damping vibrations in a structural component by forming at least part of the structural component from a composite material comprising a metal matrix and ferroelastic ceramic particulates dispersed therein.

Another aspect of the present invention is to provide a vibration damping structural component comprising a composite material including a metal matrix and ferroelastic ceramic particulates dispersed in the metal matrix.

A further aspect of the present invention is to provide a method of making a vibration damping composite material by dispersing ferroelastic ceramic particulates in a metal matrix to thereby produce the vibration damping composite material.

These and other aspects of the present invention will be more apparent from the following description.

DETAILED DESCRIPTION

Figure 1:
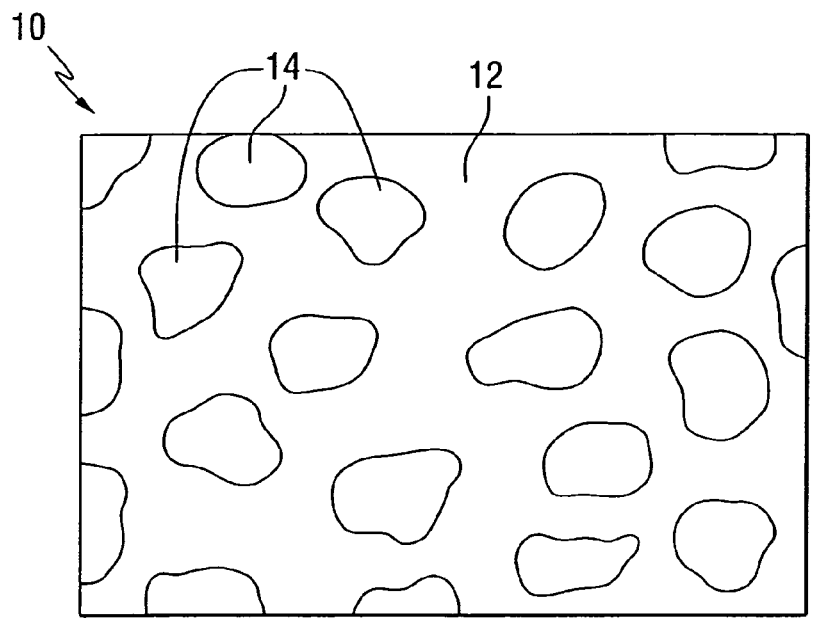
FIG. 1 is a partially schematic illustration of a composite material comprising a metal matrix with ferroelastic ceramic particulates dispersed therein in accordance with an embodiment of the present invention.

FIG. 1 schematically illustrates a composite material 10 capable of damping vibrations in accordance with an embodiment of the present invention. The composite 10 comprises a metal matrix 12 and ferroelastic ceramic particulates 14 dispersed in the metal matrix 12. When vibrations occur in the composite 10, the metal matrix 12 and ferroelastic particulates 14 are strained. This induces twinning, which is also referred to as domain motion or domain rotation, within the ferroelastic particulates 14. The composite 10 is thus able to transfer incoming vibrations into energy used to form twins in some of the ferroelastic domains. The ferroelastic ceramic particulates 14 may also strengthen the metal matrix 12 through common dispersion strengthening mechanisms such as dislocation motion hindering.

As used herein, the terms "structural material" and "structural component" mean materials and components that are subjected to mechanical loading during use. Such mechanical loading may include vibration as well as compression, tension, bending, multiaxial loading, and the like.

As used herein, the term "metal matrix" means an interconnected or continuous network comprising at least one metal. The metal matrix may comprise a single metal, metal alloys and intermetallics. The metal matrix may also have suitable mechanical properties for use in structural applications, such as adequate strength, fracture toughness and fatigue resistance. For example, the metal matrix of the composite material may have a yield strength of at least 10 to 20 MPa, and may have a fracture toughness of at least 5 to 10 MPa√m.

Some suitable matrix metals include Cu, Al, Fe, Pb, Mg, Ni, Ti, Co, Mo, Ta, Nb, W, Ni, Zn and Sn, and combinations thereof, including commercial alloys within each of these metallic groups. Preferred matrix metals include Cu, Zn, Sn, Ti, Al, Fe, Ni and Co, and combinations thereof.

In one embodiment, the matrix metal has a relatively low sintering temperature in order to avoid damage to certain types of ferroelastic ceramic particulates. Matrix metal sintering temperatures below about 850° C. may be preferred, e.g., below 800 or 700° C., depending on the type of ferroelastic ceramic dispersed in the metal matrix. The matrix metal may also have a relatively low melting temperature for some applications. For example, melting temperatures below about 1,000° C., e.g., below 900 or 800° C. may be preferred for the matrix metal.

The matrix metal typically comprises from about 35 to about 95 volume percent of the composite material, for example, from about 50 to about 80 volume percent of the composite material.

As used herein, the term "ferroelastic ceramic" means a ferroelectric material which undergoes twinning, domain rotation or domain motion of the crystallographic lattice planes when subjected to stress caused by vibrations, acoustical energy, compression, tension, bending, multiaxial loading and the like. The ferroelastic ceramic may comprise any suitable composition which produces the desired vibration damping effect when dispersed in a metal matrix, and which does not react with the matrix metal to an undesirable extent.

Some suitable ferroelastic ceramics for use in accordance with the present invention include $AgNbO_3$, $AgTaO_3$, AlN, $BaTiO_3$, $(Ba,Ca)TiO_3$, $Ba_{.4}Na_{.2}NbO_3$, $BaNb_2O_6$, $(Ba,Pb)TiO_3$, $(Ba,Sr)Nb_2O_6$, $(Ba,Sr)TiO_3$, $Ba(Ti,Zr)O_3$, $(Ba_{0.777}Ca_{0.133}Pb_{0.090})TiO_3$, BeO, $Bi_3TiNbO_9$, $Bi_3TiTaO_9$, $Bi_4Ti_3O_{12}$, $Bi_5Ti_3GaO_{15}$, $Bi_5Ti_3FeO_{15}$, $Bi_2PbNb_2O_9Bi_2PbTa_2O_9$, $Bi_3PbTi_2NbO_{12}$, $Bi_4PbTi_4O_{15}$, $Bi_4Pb_2Ti_5O_{18}$, $Bi_2CaNb_2O_9$, $Bi_2CaTa_2O_9$, $Bi_4CaTi_4O_{15}$, $Bi_2SrNb_2O_9$, $Bi_2SrTa_2O_9$, $Bi_4SrTi_4O_{15}$, $Bi_4Sr_2Ti_5O_{18}$, $Bi_2BaNb_2O_9$, $Bi_2BaTa_2O_9$, $Bi_3BaTi_2NbO_{12}$, $Bi_4BaTi_4O_{15}$, $Bi_4Ba_2Ti_5O_{18}$, $Bi_{4.5}Na_{0.5}Ti_4O_{15}$, $Bi(Na,K)Ti_2O_6$, $Bi_{4.5}K_{0.5}Ti_4O_{15}$, $BiFeO_3$, $Bi_{12}GeO_{20}$, CdS, CdSe, CdTe, $C_2H_4(NH_3)_2(C_4H_4O_6)$, $(CH_2CF_2)_n$, $C_6H_{14}N_2O_6$, $Cd_2Nb_2O_7$, CuCl, GaAs, $K_2C_4H_4O_{6-0.5}H_2O$, $KH_2PO_4$, $(K,Na)NbO_3$, $KNbO_3$, $K(Nb,Ta)O_3$, $LiGaO_2$, $LiNbO_3$, $LiTaO_3$, $LiIO_3$, $(Na_{0.5}K_{0.5})NbO_3$, (hot pressed), $(Na,Ca)(Mg,Fe,Al,Li)_3Al_{6-}(BO_3)_3(Si_6O_{18})(OH,F)_4$, $(Na,Cd)NbO_3$, $NaNbO_3$, $Na(Nb,Ta)O_3$, $(Na,Pb)NbO_3$, $Na_{0.5}Bi_{4.5}TiO_{15}$, $NaKC_4H_4O_6\cdot 4H_2O$, $NH_4H_2PO_4$, $ND_4D_2PO_4$, $Pb_{0.925}La_{0.05}Zr_{0.56}Ti_{0.44}O_3$, $(Pb_{0.58}Ba_{0.42})Nb_2O_6$, $(Pb,Ba)(Ti,Sn)O_3$, $(Pb,Ba)(Ti,Zr)O_3$, $(Pb_{0.76}Ca_{0.24})[Co1/2W1/2)_{0.04}Ti_{0.96}]O_3+2$ mol % MnO, $PbHfO_3$, $_{0.65}Pb(Mg1/3Nb2/3)O_3$-$_{0.35}PbTiO_3$, $PbNb_2O_6$, $Pb(Nb,Ta)_2O_6$, $PbSnO_3$, $(Pb,Sr)Nb_2O_6$, $(Pb,Sr)(Ti,Zr)O_3$, $PbTiO_3$, $PbTiO_3\cdot BiFeO_3$, $PbTiO_3\cdot Pb(Fe_{0.5}Nb_{0.5})O_3$, $PbTiO_3\cdot Pb(Mg1/3Nb2/3)O_3$, $PbTiO_3\cdot Pb(Zn1/3Nb2/3)O_3$, $Pb(Ti,Sn)O_3$, $Pb(Ti,Zr)O_3$, $Pb(Ti,Zr)O_3\cdot Pb(Fe_{0.5},Nb_{0.5})O_3$, $Pb(Ti,Zr)O_3\cdot Pb(Mg1/3Nb2/3)O_3$, $Pb(Ti,Zr)O_3\cdot Pb(Ni1/3Nb2/3)O_3$, $Pb(Ti,Zr)O_3$, $Pb(Ti,Zr,Sn)O_3$, $PbZrO_3$, $PbZrO_3BaZrO_3$, $Pb(Zr,Sn,Ti)O_3$, g-Se, a-$SiO_2$, $SrBi_4TiO_{15}$, $Sr_2Ta_2O_7$, $SrTiO_3$, $WO_3$, ZnO, b-ZnS, ZnSe, ZnTc.

One group of ferroelastic ceramics suitable for use in accordance with the present invention includes oxides of metals selected from Ba, Sr, Ca, Pb, Ti, Zr, Mg, La and/or Nb. For example, the ferroelastic ceramics may comprise $Pb(Mg1/3Nb2/3)O_3$ (PMN) or metal titanates such as $BaTiO_3$, $PbTiO_3$, $Pb(Ti,Zr)O_3$ (PZT) and/or $Pb(La,Ti,Zr)O_3$ (PLZT), with $BaTiO_3$ and $PbTiO_3$ being particularly suitable ferroelastic ceramics. Metal oxides such as ZnO and $SiO_2$ may also be suitable.

Figure 2A:
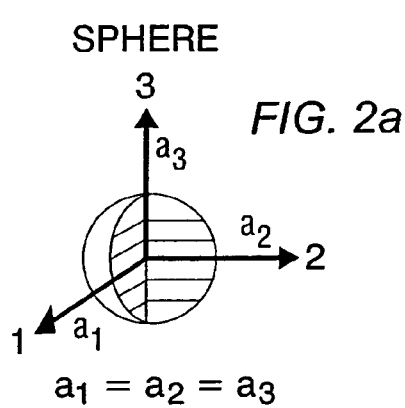
FIG. 2a-2c. illustrate spherical, spheroidal and disc shapes of ferroelastic ceramic particulates, respectively, in accordance with embodiments of the present invention.
Figure 2B:
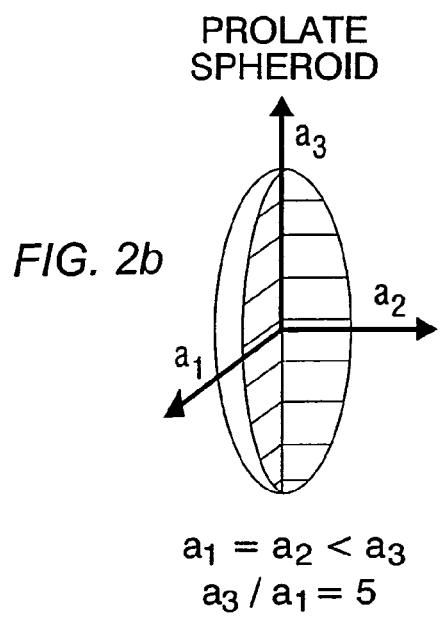
Figure 2C:
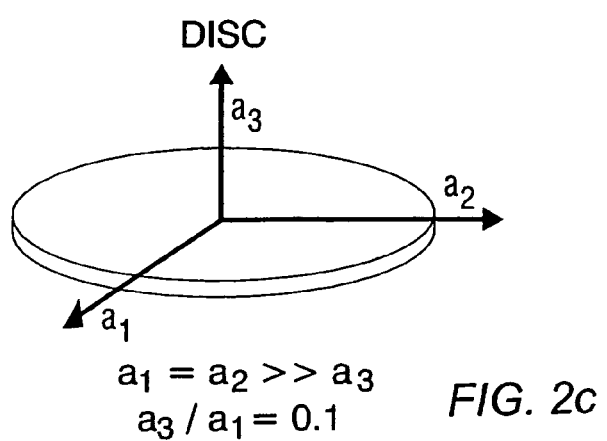

The ferroelastic ceramic is provided in the form of particulates which may have any desired shape such as equiaxed, elongated, plate, rod, fiber, and ellipsoidal shapes. FIGS. 2a, 2b and 2c illustrate spherical, spheroidal and disc-shaped particulates, respectively. The particulates are preferably discontinuous and are dispersed in the metal matrix. The particulates may have any desired size, for example, average diameters of from about 0.5 microns to about 2 mm may be suitable, typically from about 0.5 microns to about 100 microns. Disc-shaped reinforcements may provide high levels of twinning. Reinforcement geometries that favor high load transfer from the matrix to the reinforcement (aspect ratios less or greater than one) will lead to higher damping potential as predicted by this model.

Figure 3:
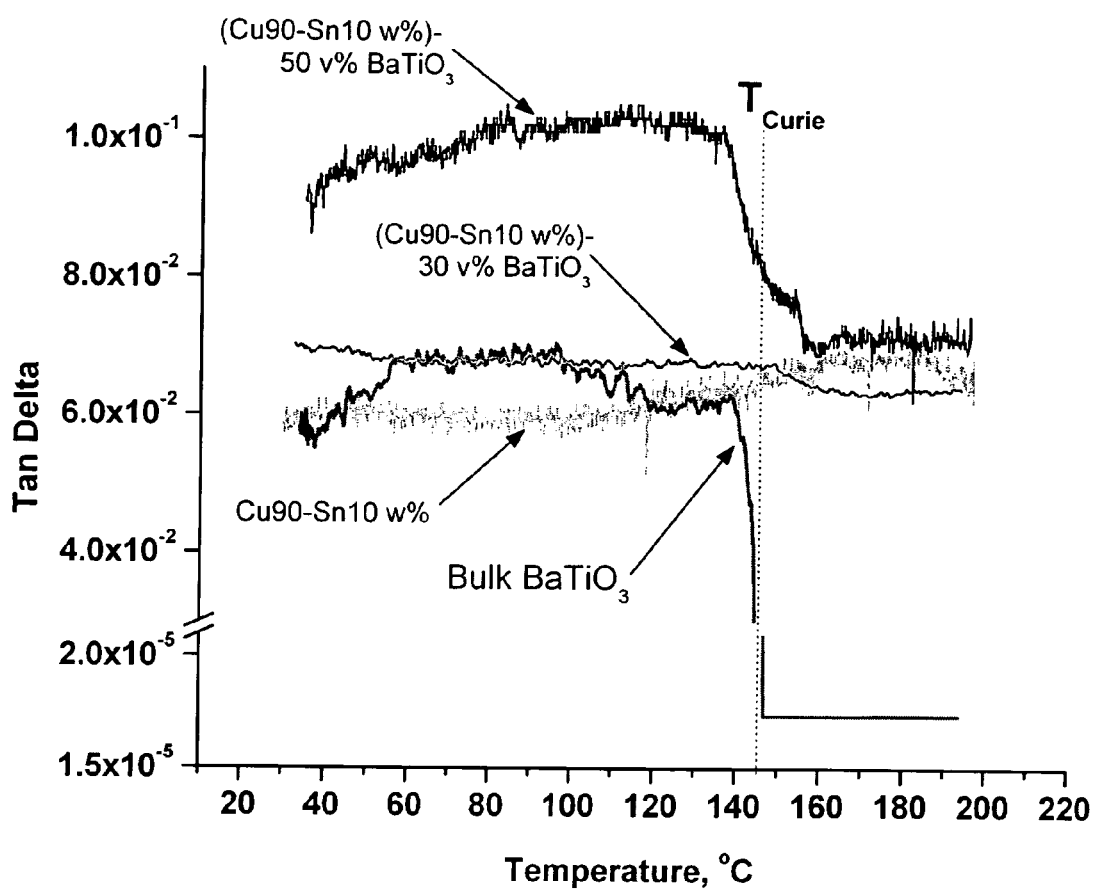
FIG. 3 is a graph illustrating vibration damping characteristics for a composite material comprising a Cu—Sn metal matrix with 50 volume percent $BaTiO_3$ ferroelastic ceramic particulates dispersed therein in accordance with an embodiment of the present invention, showing an increase in vibration damping ability below the Curie temperature of the $BaTiO_3$ reinforcements.

A composite was made by blending Cu, Sn and $BaTiO_3$, followed by liquid phase sintering at 820° C. for 6 minutes to form a (Cu—Sn)$BaTiO_3$ composite material. Referring now to FIG. 3, a plot of the damping capacity (tan delta) as a function of temperature for the Cu—Sn matrix with bulk $BaTiO_3$ particulates. Composites with 30 and 50 percent $BaTiO_3$ by volume were tested. Tan delta is a loss coefficient representing damping capability. Below the Curie temperature, damping in the composites is due to three mechanisms: ferroelastic-damping from the reinforcement, composite damping due to interfacial relations, and matrix twinning. Above the Curie temperature only the latter two mechanisms contribute to damping in the composites. A distinct decrease in the damping capacity of the $BaTiO_3$ is observed at the Curie temperature. Thus, the damping properties of the composite are due in part to the ferroelastic character of $BaTiO_3$ below the Curie temperature. Ferroelastic damping results from the stress-induced twinning of the ferroelastic domains during cyclic loading. Reorientation of the domains occurs by formation of the 90 degree twins.

The ferroelastic ceramic particulates typically comprise from about 5 to about 65 volume percent of the composite, typically from about 20 to about 50 volume percent. Each ferroelastic ceramic particulate may comprise a single crystal, or may comprise multiple crystals or grains. The ferroelastic particulates can be randomly dispersed and oriented within metal matrix with respect to any reference direction. The present composite materials possess favorable vibration damping, e.g., a vibration damping loss coefficient of greater than $1 \times 10^{-4}$. For example loss coefficients (tanδ) of greater than 0.1 may be achieved, typically greater than 0.001.

The composite materials may be formed by densifying techniques following processes such as conventional blending, solvent-mediated reaction synthesis (SMRS) and mechanical alloying (MA). SMRS is performed by formulating and blending precursor constituents of the nominal composite formulation desired. If thermodynamically favorable, a synthesis reaction can be initiated, e.g., using an induction power heating source. The as-synthesized product may be crushed to ensure homogeneity, and subsequently densified using powder metallurgy techniques such as sintering, hot isostatic pressing or hot pressing. Mechanical alloying is performed by formulating and ball milling precursor constituents of the desired nominal composite formulation. The milling provides energy to initiate the synthesis reaction. The as-synthesized product is densified using powder metallurgy techniques such as sintering, hot isostatic pressing or hot pressing. If produced using a solvent-mediated, in situ reaction synthesis technique, such a composite may derive benefit from certain microstructural attributes known to be characteristic of the process, notably, clean matrix-particulate interfaces, single crystal reinforcement, and a broad ability to vary reinforcement size and volume fraction.

Characterization of multifunctional composite materials can be difficult due to shielding of the embedded reinforcement by the matrix. Specifically, in the case of the ferroelastic reinforced metal matrix composites, the metal matrix physically and electrically shields the ferroelastic particulates, thus prohibiting direct electrical and dimensional observations as a means of quantifying domain motion under an applied load. However, observation of the ferroelectric particulates was accomplished by measuring lattice strain, by neutron diffraction, in the matrix and reinforcement simultaneously under applied load in two orthogonal directions. The spectrometer used a horizontal load frame that is oriented such that the loading axis is 45 degrees from the incident neutron beam and the detector banks are positioned on both sides of the load frame oriented at 90 degrees relative to the load frame. The orientation of the load frame and location of the detector banks with respect to the incident beam are such that crystallographic planes which diffract into one detector bank have lattice plane (002) normals perpendicular to the loading direction and crystallographic planes which diffract into a second detector bank have lattice plane (200) normals parallel to the loading direction. Accordingly, orientation of a tetragonal unit cell will have diffraction of (002) planes into detector bank 1 and (200) planes into detector bank 2. If the unit cell was rotated +/−90° relative to the incident beam, as would occur in twinning, then the banks into which the planes diffract would switch because of the 90° rotation of the planes normals. Thus, changes in the ratio of peak intensities of the (200) and (002) planes in a single bank are indicative of twinning.

Figure 4:
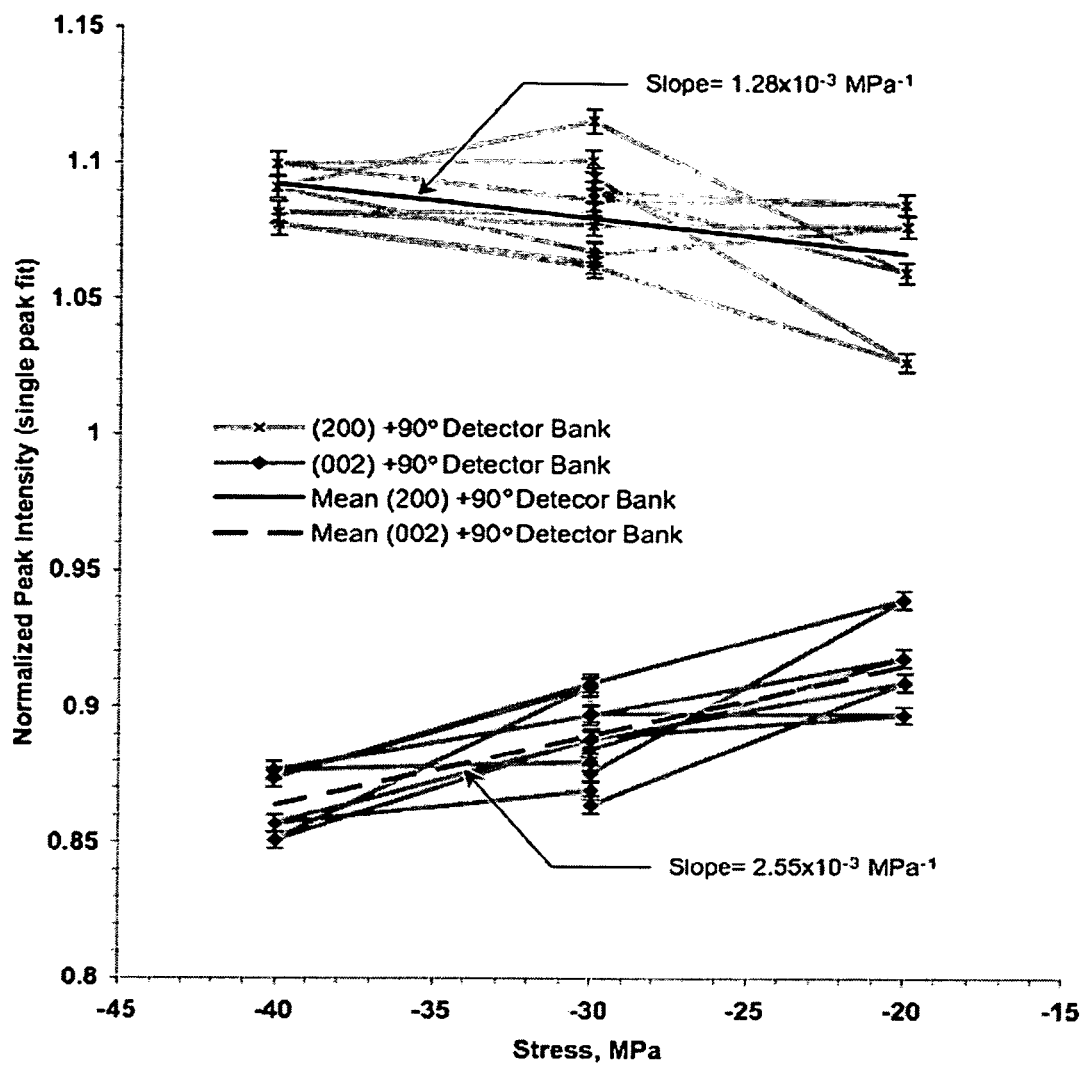
FIG. 4 is an graph illustrating normalized peak intensity at a first and second detector for $BaTiO_3$ (200) and (002) planes from in situ neutron diffraction during cyclic loading of a (Cu—Sn)$BaTiO_3$ composite material of the present invention at 25° C.

To confirm that stress transfer from the matrix to the reinforcement leads to twinning in the reinforcement, in situ neutron diffraction patterns were collected during cyclic compression loading on a (Cu—Sn)-BaTiO$_3$30 vol. % sample. The form of the cyclic compressive loading was sinusoidal, an amplitude of 10 MPa superimposed on a constant compressive stress of 30 MPa; neutron diffraction patterns were collected for cycles 1, 2, 5, 10, 25, and 50. FIG. 4 shows the normalized peak intensities for the (002) and (200) planes as a function of the macroscopic stress state of the composite for cycles 5, 10, 25, and 50. Peak intensities were determined from single peak fits to neutron diffraction patterns from the +90° detector bank. In a tetragonal system such as BaTiO$_3$, changes in the ration of the (002) and (200) peak intensities with applied stress are a direct observation of deformation twinning.

FIG. 4 shows that as the magnitude of the macroscopic compressive load increases the number of (002) planes satisfying the Bragg condition decreases and the number of (200) planes meeting the Bragg condition increases; upon unloading the intensities in the two peaks return to their initial values. Over the applied stress range of −20 to −40 MPa, increasing the compressive load results in the formation of deformation twins with (002) lattice-plane-normal preferentially oriented perpendicular to the loading direction and as the compressive load is removed detwinning occurs. A linear least squares fit of the intensity as a function of stress is also shown on the figure for both planes. The slope of the lines is proportional to number of domains with a plane normal oriented such that Bragg condition is met. The slope of the (200) line is half the (002) because there are twice as many (200) planes as (002) planes and the absolute intensity changes for the (200) and (002) planes are equal, thus when the intensity is normalized slopes are different by a factor of ½. This supports the conclusion that the observed twinning/detwinning that occurs during cyclic loading, as observed by in situ neutron diffraction, leads to enhanced damping in ferroelastic reinforced metal matrix composites below the Curie temperature.

Figure 5:
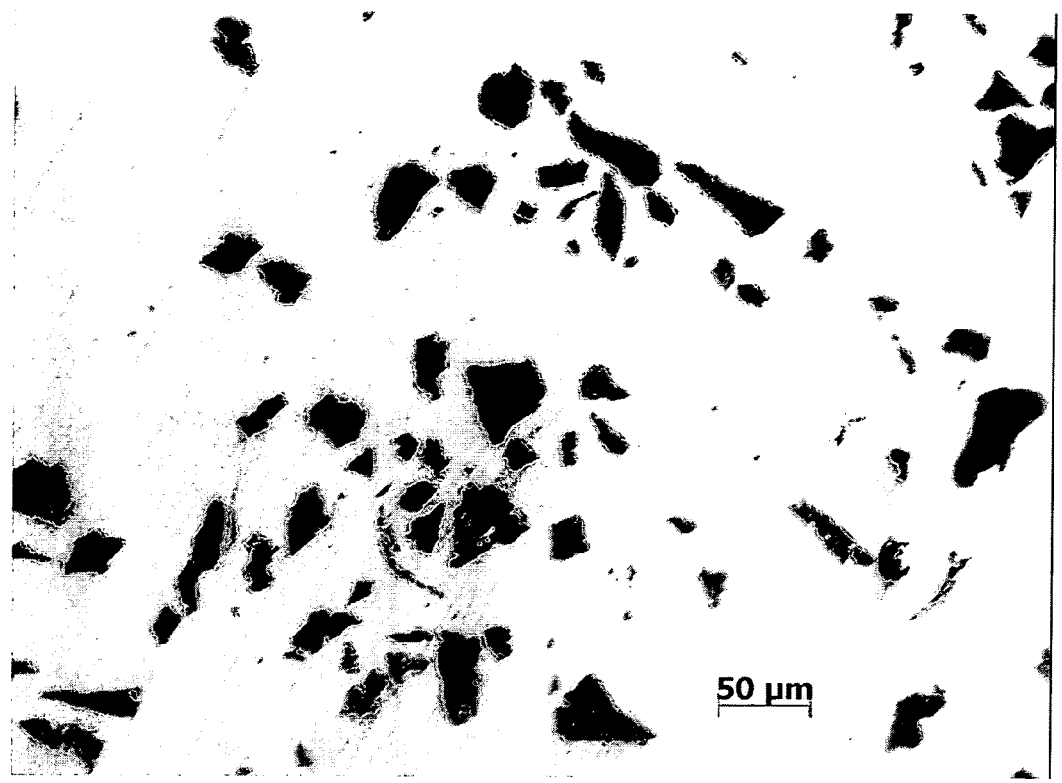
FIG. 5 is a micrograph of a Ni—$BaTiO_3$ composite material produced in accordance with an embodiment of the present invention.

Another composite material comprising a nickel matrix and BiTiO$_3$ ferroelectric particulates was made. The composite was made by an electroplating technique referred to as electroforming. BaTiO$_3$ was suspended in a nickel-electroplating bath and as the nickel is plated onto the substrate (cathode) some BaTiO$_3$ is incorporated into the nickel structure being deposited. Coating the BaTiO$_3$ with a metal can increase the amount of BaTiO$_3$ incorporated into the nickel. The metal coating can be applied to the BaTiO$_3$ by electroless plating or other processes which can be used to deposit metal on nonconductors. FIG. 5 is a photomicrograph of the resultant Ni—BaTiO$_3$ composite material.

The present composite materials can be used in any applications where strength and damping are important system requirements. A great flexibility in synthesis routes and processing allows for a high degree of composite system design. Through variances in reaction system stoichiometry and chemistry, these composites can be tailored to meet a great number of performance criteria including corrosion, fatigue, and creep resistance, and mechanical property levels such as high hardness, stiffness, and yield strengths. Numerous potential applications thus exist that will only fully be realized when design problems present themselves and material systems are created to solve them. Examples might include numerous individual components on vehicles (aircraft, automobile, military, marine), marine propellers, building materials, etc.

Whereas particular embodiments of this invention have been described above for purposes of illustration, it will be evident to those skilled in the art that numerous variations of the details of the present invention may be made without departing from the invention as defined in the appended claims.

The invention claimed is:

1. A method of damping vibrations in a structural component comprising forming at least a part of the structural component from a composite material comprising a metal matrix and ferroelastic ceramic particulates in the metal matrix.

2. The method of claim 1, wherein the ferroelastic ceramic particulates comprise at least one oxide of a metal comprising Ba, Sr, Ca, Pb, Ti, Zr and/or Nb.

3. The method of claim 1, wherein the ferroelastic ceramic particulates comprise BaTiO$_3$, ZnO, PbTiO$_3$, Pb(Ti,Zr)O$_3$, Pb(Mg$_{1/3}$Nb$_{2/3}$)O$_3$, (Ba,Sr)TiO$_3$ and/or Pb(La,Ti,Zr)O$_3$.

4. The method of claim 1, wherein the ferroelastic ceramic particulates comprise BaTiO$_3$.

5. The method of claim 1, wherein the ferroelastic ceramic particulates comprise from about 5 to about 65 volume percent of the composite.

6. The method of claim 1, wherein the ferroelastic ceramic particulates comprise from about 20 to about 50 volume percent of the composite.

7. The method of claim 1, wherein the ferroelastic ceramic particulates are substantially equiaxed.

8. The method of claim 1, wherein the ferroelastic ceramic particulates are substantially elongated.

9. The method of claim 1, wherein the ferroelastic ceramic particulates are substantially disc shaped.

10. The method of claim 1, wherein the ferroelastic ceramic particulates have an average particle size of from about 0.5 micron to about 2 mm.

11. The method of claim 1, wherein the ferroelastic ceramic particulates have an average particle size of from about 0.5 to about 100 microns.

12. The method of claim 1, wherein the metal matrix comprises Cu, Al, Fe, Pb, Mg, Ni, Ti, Co, Mo, Ta, Nb, W, Ni and/or Sn.

13. The method of claim 1, wherein the metal matrix comprises Cu, Sn, Ti, Al, Fe, Ni and/or Co.

14. The method of claim 1, wherein the metal matrix comprises from about 35 to about 95 volume percent of the composite.

15. The method of claim 1, wherein the metal matrix comprises from about 50 to about 80 volume percent of the composite.

16. The method of claim 1, wherein the composite material has a yield strength of at least 10 MPa.

17. The method of claim 1, wherein the composite material has a fracture toughness of at least 5 MPa$\sqrt{m}$.

18. The method of claim 1, wherein the composite material has a vibration damping loss coefficient of greater than $1 \times 10^{-4}$.

19. The method of claim 1, wherein the ferroelastic ceramic particulates undergo twinning under cyclic loading.

20. The method of claim 19, wherein the twinning is reversible.

21. The method of claim 19, wherein the twinning comprises 90 degree twinning of crystallographic lattice planes of the ferroelastic ceramic particulates.

22. The method of claim 1, wherein the ferroelastic ceramic particulates are randomly oriented within the metal matrix.

23. A vibration damping structural component comprising a composite material including a metal matrix and ferroelastic ceramic particulates dispersed in the metal matrix.

* * * * *